United States Patent [19]
Hsing et al.

[11] Patent Number: 6,011,311
[45] Date of Patent: Jan. 4, 2000

[54] MULTILEVEL INTERCONNECT STRUCTURE FOR INTEGRATED CIRCUITS

[75] Inventors: Edward Hsien-Sheng Hsing, Hsinchu; Jen-Der Hong, Taoyuan Hsien, both of Taiwan

[73] Assignee: Nan Ya Technology Corporation, Taiwan

[21] Appl. No.: 09/059,938

[22] Filed: Apr. 14, 1998

[30] Foreign Application Priority Data

Jan. 7, 1998 [TW] Taiwan .................................. 87100149

[51] Int. Cl.[7] .................................................. H01L 23/48
[52] U.S. Cl. .......................... 257/774; 257/767; 257/758; 257/741
[58] Field of Search ..................... 257/774, 767, 257/758, 741, 765, 763, 762

[56] References Cited

U.S. PATENT DOCUMENTS

| | | | |
|---|---|---|---|
| 4,916,002 | 4/1990 | Carver | 428/139 |
| 5,434,452 | 7/1995 | Higgins, III | 257/773 |
| 5,438,223 | 8/1995 | Higashi et al. | 257/774 |
| 5,619,071 | 4/1997 | Myers et al. | 257/753 |

*Primary Examiner*—John F. Niebling
*Assistant Examiner*—Neal Berezny
*Attorney, Agent, or Firm*—Fish & Richardson P.C.

[57] ABSTRACT

A multilevel interconnect structure includes a lower conducting layer, a dielectric layer formed on the lower conducting layer, an upper conducting layer formed partly on the dielectric layer, and an I-shaped via plug for electrically connecting the lower conducting layer and the upper conducting layer. The I-shaped via plug has an upper portion which laterally extends into the upper conducting layer, and a lower portion which undercuts the lower conducting layer.

9 Claims, 6 Drawing Sheets

MULTILEVEL INTERCONNECT STRUCTURE FOR INTEGRATED CIRCUITS

BACKGROUND OF THE INVENTION

1. Field of the Invention

The present invention generally relates to a multilevel interconnect structure, and more particularly to an I-shaped via plug therein.

2. Description of Related Art

In order to build modern integrated circuits, it is necessary to fabricate millions of active devices such as transistors on a single substrate. These individual devices are interconnected by means of metal wiring to form circuits. Further, via plugs are used to connecting lower and upper metal wirings. Since active devices invariably require more than one level of interconnect, multilevel interconnect structures are key elements for ULSI technology. Moreover, the quality of via plug is relative to the reliability of the integrated circuits.

FIGS. 1–4 are cross-sectional views depicting the procedural steps involved in a conventional method of fabricating a multilevel interconnect structure.

Referring to FIG. 1, semiconductor devices (not shown) such as transistors are formed on a substrate 100 made of silicon. Thereafter, an insulating layer or an inter-layer dielectric (ILD) 120 is deposited over the overall surface of the substrate 100 for isolating each transistor from other conductive layers (to be formed later). A lower metal wiring 140 composed of a single aluminum or aluminum alloy and an inter-metal dielectric (IMD) 160 made of low-permittivity insulating materials are sequentially deposited on the ILD 140. Al wiring and low-permittivity insulating materials provide a large margin for improving RC delay. In addition, a lower dielectric constant also reduces the line capacitance and thus cuts down the cross talk between conductors.

Next, referring to FIG. 2, a via hole 200 is formed in the IMD 160 by means of a photolithography process. Then, referring to FIG. 3, a metal layer 300 made of tungsten material is deposited in the via hole 200 as well as on the IMD 160.

Then, referring to FIG. 4, etching back the metal layer 300 leaves a via plug 350 in the via hole 200. After that, an upper metal wiring 400 composed of a single aluminum or aluminum alloy is formed. Electrical connections are made between the upper metal wiring 400 and the lower metal wiring 140 through the use of via plug 350.

However, with a multilevel interconnect structure, it is necessary to pass current from one level of metal wiring to another through via plugs. When the metal design rules are scaled down, the size of the via hole also shrinks, thus increasing the current density in the via plug. Electromigration can occur as a result of crowding current flow through contact interfaces 440 and 420 between the via plug 200 and metal wirings 140 and 400, causing the formation of voids (not shown) in the metal wirings 140 and 400. Such voids may grow to a size that results in an open-circuit and cause failure of electrical connections. That is to say, the known multilevel interconnect structure shown in FIG. 4 can not be utilized, because the via contact resistance increases and the reliability of the device is reduced because of electromigration.

U.S. Pat. No. 5,619,071 discloses an anchord via connection (plug), which extends into and undercuts an underlying interconnection line (lower metal wiring) to lock the via connection into the interconnection line.

However, as described above, electromigration still occurs as a result of crowding current flow through the upper contact interface between the via plug and the upper metal wiring. In addition, high contact resistance is generated due to the small cross section of the upper contact interface. Furthermore, the upper contact interface and the lower contact interface are not symmetric.

SUMMARY OF THE INVENTION

It is therefore an object of the present invention to provide a multilevel interconnect structure to reduce the contact resistance by increasing the metal wiring/via plug contact area without increasing the via hole size.

In accordance with an aspect of the present invention, there is provided an I-shaped via plug having an upper portion which laterally extends into an upper interconnection line, and a lower portion which undercuts a lower interconnection line.

The present invention achieves the above-indicated object by providing a method of fabricating a multilevel interconnect structure, comprising the steps of: (a) providing a semiconductor substrate; (b) forming a first dielectric layer over the semiconductor substrate; (c) forming a first conducting layer over the first dielectric layer; (d) forming a second dielectric layer over the first conducting layer; (e) forming a mask layer over the second dielectric layer; (f) patterning the mask layer to form a first opening in which a portion of the second dielectric layer is exposed; (g) forming an insulating layer over the mask layer and filling into the first opening; (h) etching back the insulating layer to form an insulating spacer on the sidewall of the mask layer; (i) forming a second opening through the second dielectric layer and a concave hole undercutting the first conducting layer by using the mask layer and the insulating spacer as masking; (j) removing the insulating spacer on the sidewall of the mask layer to form an I-shaped via hole; (k) forming a second conducting layer over the mask layer and filling into the I-shaped via hole; (l) planarizing the second conducting layer to form an I-shaped via plug having an upper portion and a lower portion; (m) removing the mask layer to expose the upper portion of the I-shaped via plug; and (n) forming a third conducting layer over the second dielectric layer and the I-shaped via plug, wherein the upper portion laterally extends into the third conducting layer and the lower portion undercuts the first conducting layer.

Moreover, the above-indicated object can be achieved by providing a multilevel interconnect structure comprising: a first conducting layer; a dielectric layer formed on the first conducting layer; a second conducting layer formed partly on the dielectric layer; and an I-shaped via plug for electrically connecting the first conducting layer and the second conducting layer, wherein the I-shaped via plug has an upper portion laterally extending into the second conducting layer and a lower portion undercutting the first conducting layer.

BRIEF DESCRIPTION OF THE DRAWINGS

The following detailed description, given by way of example and not intended to limit the invention solely to the embodiments described herein, will best be understood in conjunction with the accompanying drawings, in which:

FIG. 5 through FIG. 13 schematically depict in cross-sectional views procedural steps involved in a method of

3 fabricating a multilevel interconnect structure according to one embodiment of the present invention.

DETAILED DESCRIPTION OF THE INVENTION

FIG. 5 through FIG. 13 schematically depict in cross-sectional views procedural steps involved in a method of fabricating a multilevel interconnect structure according to one embodiment of the present invention. The multilevel interconnect structure can be applied to integrated devices.

Figure 1:
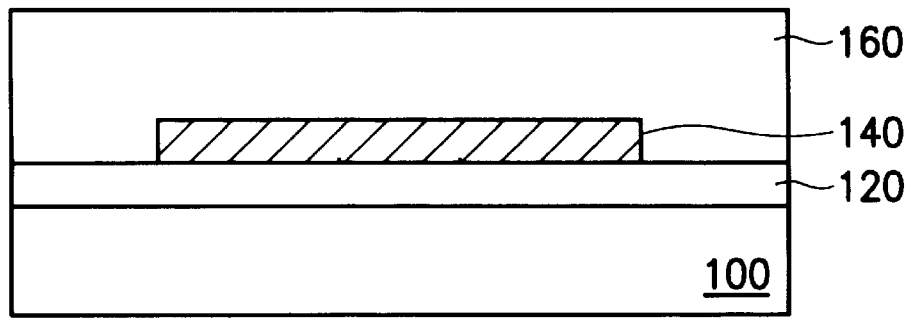
FIG. 1 through FIG. 4 schematically depict in cross-sectional views procedural steps involved in a conventional method of fabricating a multilevel interconnect structure.
Figure 2:
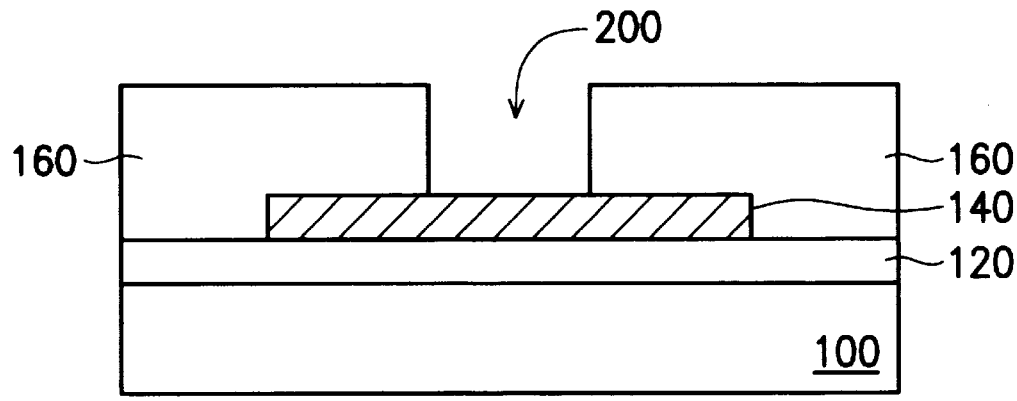
Figure 3:
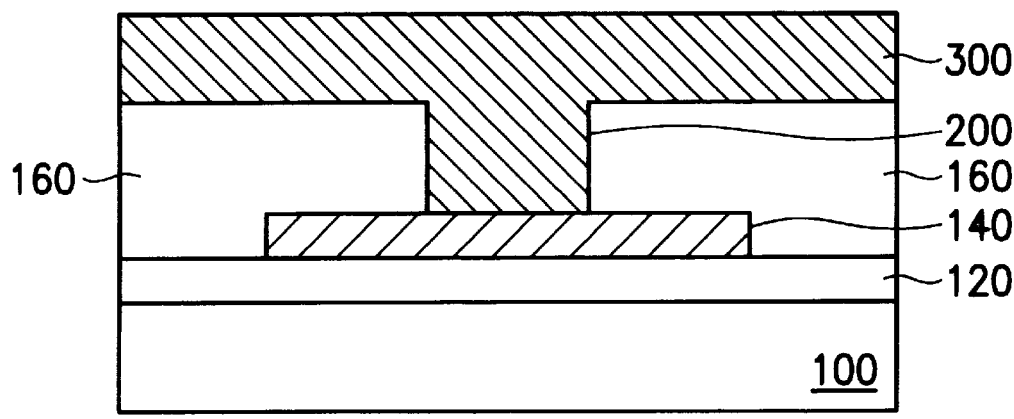
Figure 4:
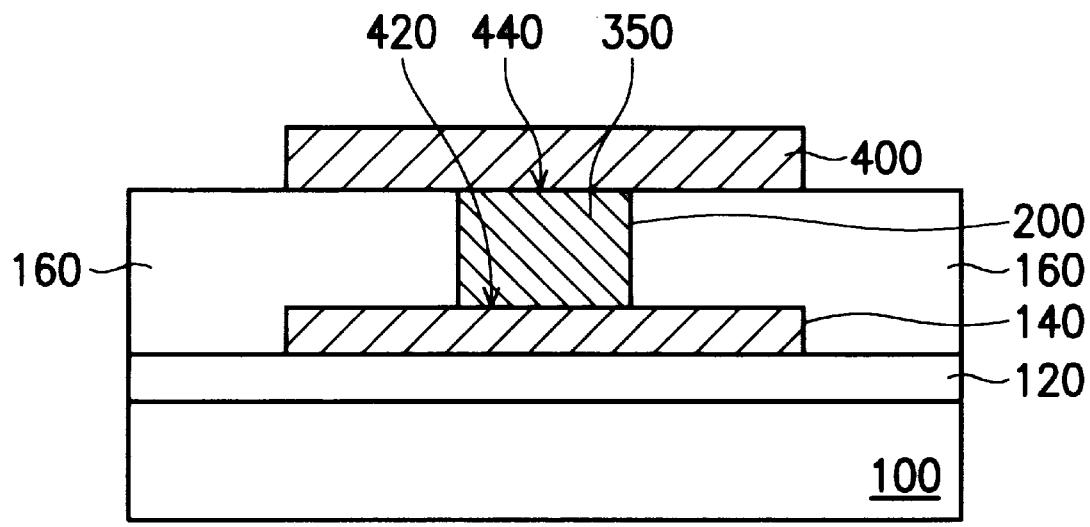
Figure 5:
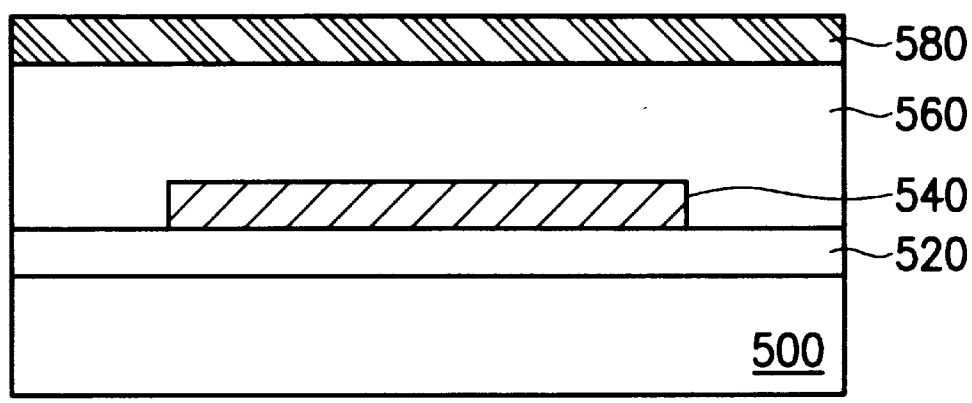

Referring to FIG. 5, a substrate 500 made of semiconductor material such as silicon, germanium or gallium-arsenide, might be provided by means of epitaxial processes or silicon-on-insulator (SOI) processes. For convenience, a P-type silicon substrate is exemplified.

By thermal oxidation, field insulators (not shown) are formed on the substrate 500 to define an active region therebetween. Semiconductor elements such as transistors are fabricated, by process of deposition, photolithography, etching, ion implantation, etc., on the substrate 500 within the active region. Reference numeral 520 represents an insulating layer or ILD layer formed over the substrate 500 for isolation.

For example, the ILD layer 520 is deposited over the substrate 500 and then planarized by means of thermal reflow processes. The ILD layer 520 might be made of silicon dioxide or borophosphosilicate glass.

Next, a conducting layer made of metal materials is formed on the ILD layer 520 by sputtering, such as magnetron DC sputtering. Then the metal layer is selectively etched in accordance with a desired pattern to form a lower metal wiring 540 as a lower interconnection line.

The lower metal wiring 540 can be composed of a single aluminum (Al) or aluminum alloy such as AlSiCu or AlCu. Accordingly, Cu is alloyed to Al to enhance the electromigration lifetime and Si is often alloyed into Al to prevent Al spikes.

Sequentially, an inter-metal dielectrics (IMD) 560 made of low-permittivity insulating materials is deposited on the lower metal wiring 540 and the ILD layer 520. Then, the inter-metal dielectrics (IMD) layer 560 is planarized by means of chemical mechanical polishing processes (CMP). The IMD layer 560 might be made of silicon dioxide deposition by means of chemical vapor deposition (CVD) at a temperature of about 400° C. Preferably, the IMD layer 560 has a thickness of about 1000 Å.

Moreover, an mask layer 580 is formed on the IMD layer 560. Preferably, the mask layer can be formed by the deposition of silicon nitride. For example, the mask layer 580 can be formed by means of low-pressure chemical vapor deposition processes by reacting $SiH_2Cl_2$ with $NH_3$ as masking for subsequent etching processes. Preferably, the mask layer 580 has a thickness of about 3000 Å.

Figure 6:
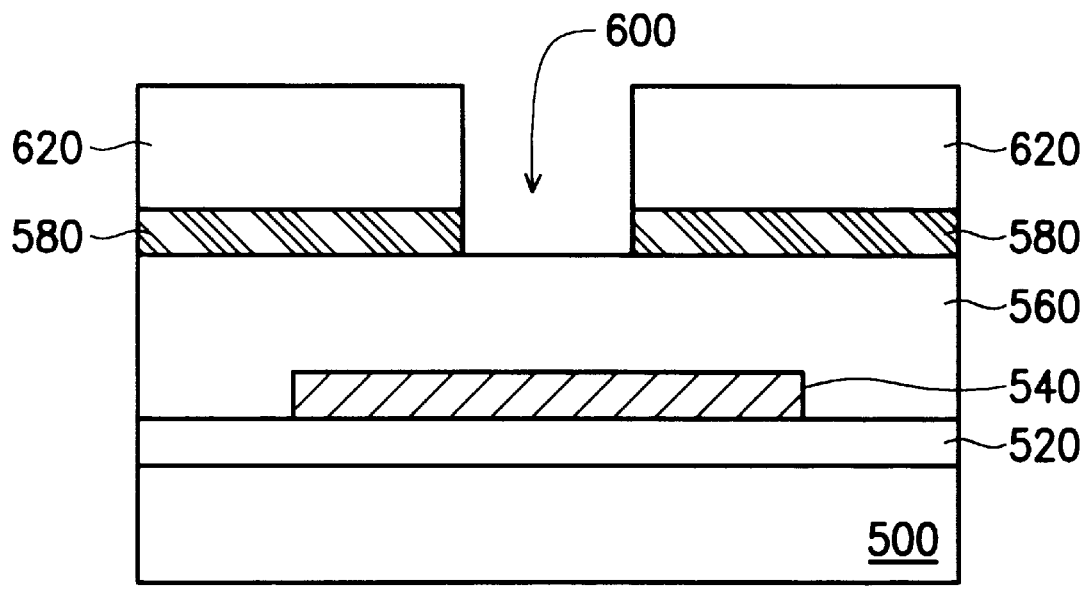

Referring to FIG. 6, the mask layer 580 has been patterned and etched as shown to form an opening 600. For example, a photoresist layer 620 is coated over the mask layer 580 and patterned by means of photolithography. Then, by using the patterned photoresist layer 620, the mask layer 580 forms the opening 600 anisotropically etched. Preferably, the etching process is implemented by means of reactive ion etching process making use of $CHF_3$ as reactant to etch the mask layer 580 in order to expose a portion of the IMD layer 560. Then, the patterned photoresist layer 620 is removed.

Figure 7:
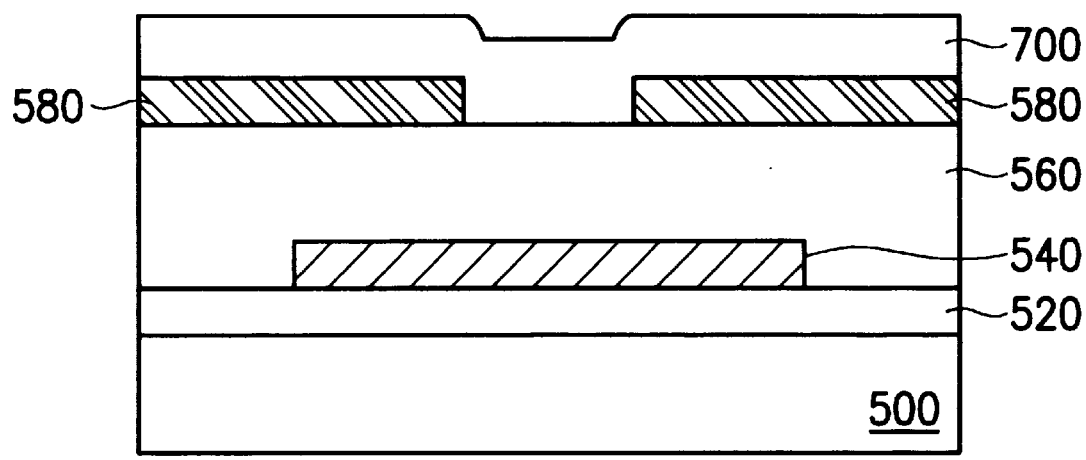

As shown in FIG. 7, an insulating layer 700 is formed over the mask layer 580. Preferably, the insulating layer 700 is made of polyimide materials. For example, the polyimide layer is spun on over the underlying mask layer 580 and the exposed IMD layer 560 in the form of a liquid. During a high-temperature-cure step at a temperature of about 150° C. for 30 min, the liquid polyimide layer becomes the solid polyimide layer 700. The cured polyimide layer 700 can fill the small or high-aspect-ratio opening 600 without producing voids.

Figure 8:
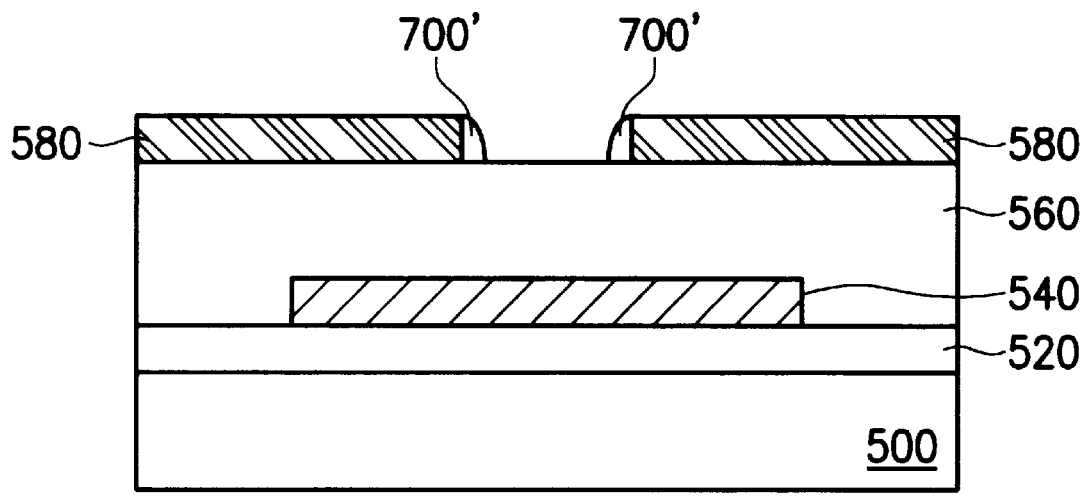

As depicted in FIG. 8, an insulating spacer 700' adjacent to the sidewalls of the mask layer 580 is formed by, for example, etching back the cured polyimide layer 700 to expose the top surface of the mask layer 580 and a portion of the IMD layer 560. Preferably, reactive ion etch processes are implemented to etch back the polyimide layer 700 by using oxygen-based plasmas as reactant.

Figure 9:
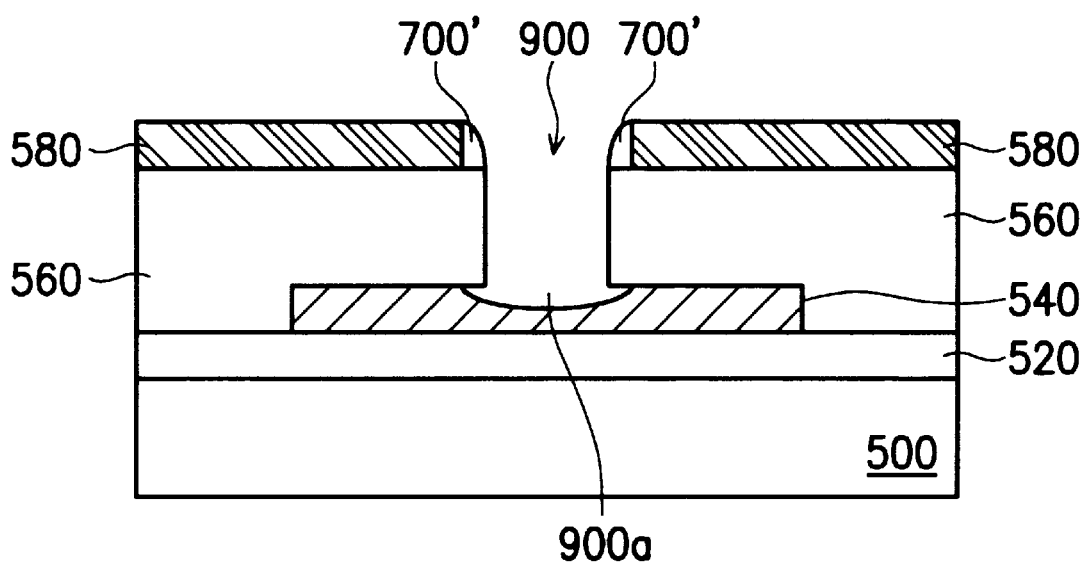

Next, referring to FIG. 9, an opening 900 is formed through IMD layer 560. For example, by using the mask layer 580 and the insulating spacers 700' as masking, the IMD layer 560 has been patterned and anisotropically etched as shown to form opening 900. Preferably, the etching process is implemented by means of a reactive ion etching process making use of $CHF_3$ as reactant to etch the IMD layer 560 in order to expose a portion of the lower metal wiring 540. Then, an isotropic wet etch is implemented to laterally etch away beneath the lower metal wiring 540, forming a concave hole 900a which undercuts the lower metal wiring 540.

Figure 10:
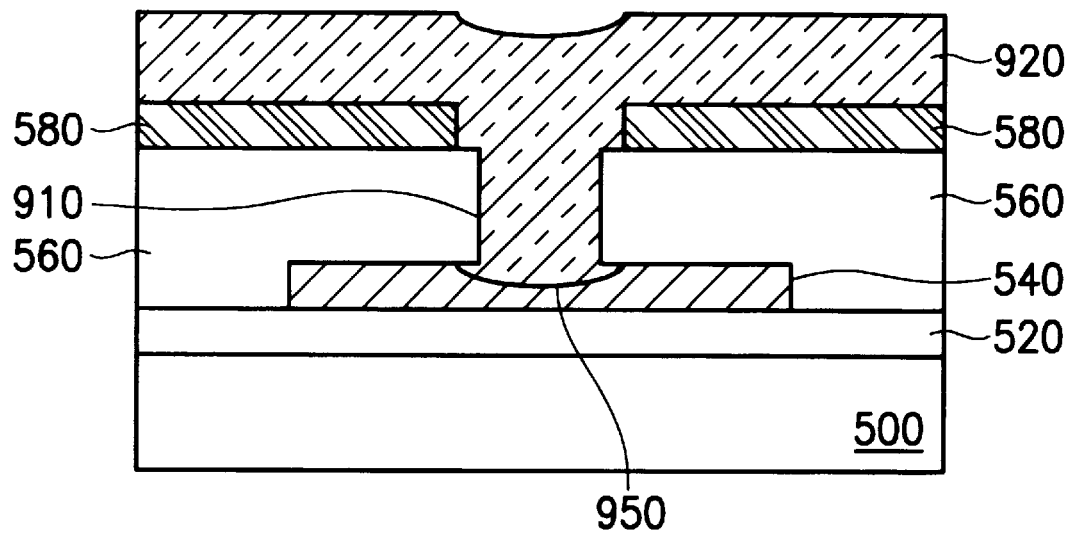

Referring to FIG. 10, an via hole 910 is formed by removing the insulating spacers 700' adjacent to the sidewalls of the mask layer 580. Next, a conducting layer 920 is formed over the substrate 500. That is, the conducting layer 920 is formed by, for example, blanket depositing a metal layer over the mask layer 580 and filling in the via hole 910 and concave hole 900a. Preferably, the metal layer is a tungsten layer formed by means of a chemical vapor deposition process with a chemistry comprising $WF_6$.

Figure 11:
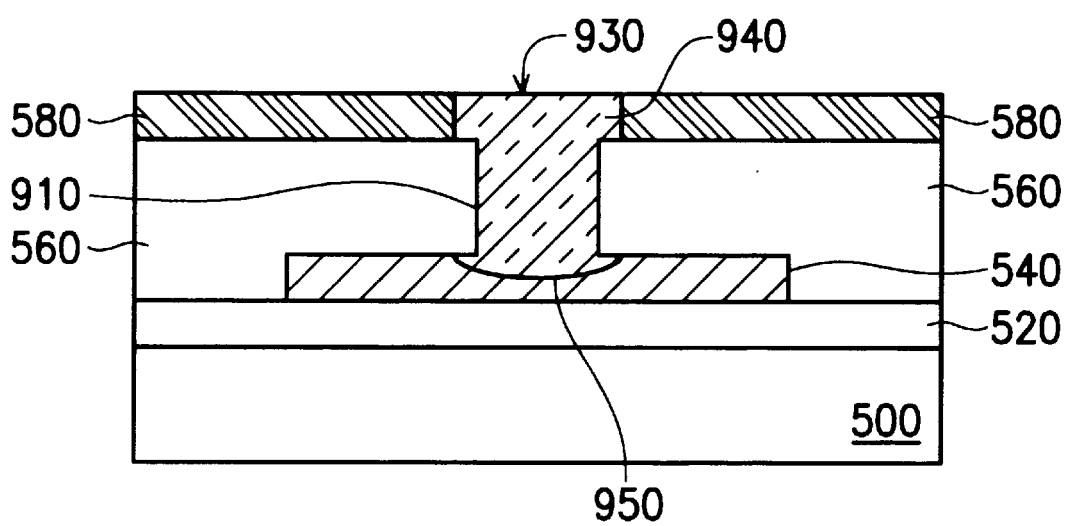

Referring to FIG. 11, the tungsten layer 920 is etched back to form an I-shaped via plug 930 having an upper portion 940 and a lower portion 950. Preferably, the tungsten layer 920 is planarized by means of chemical mechanical polishing processes (CMP). In addition, reactive ion etch processes can be implemented to etch back the tungsten layer 920 by using $CF_4/O_2$, $NF_3/O_2$, or $SF_6/Ar$ as reacting gases.

Figure 12:
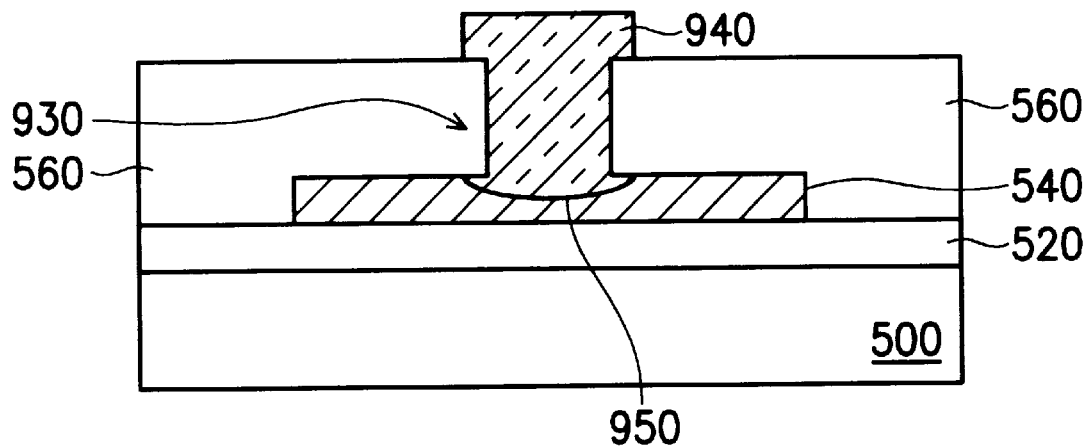

Referring to FIG. 12, the mask layer 580 is removed in order to expose the upper portion 940 of the I-shape via plug 930.

Figure 13:
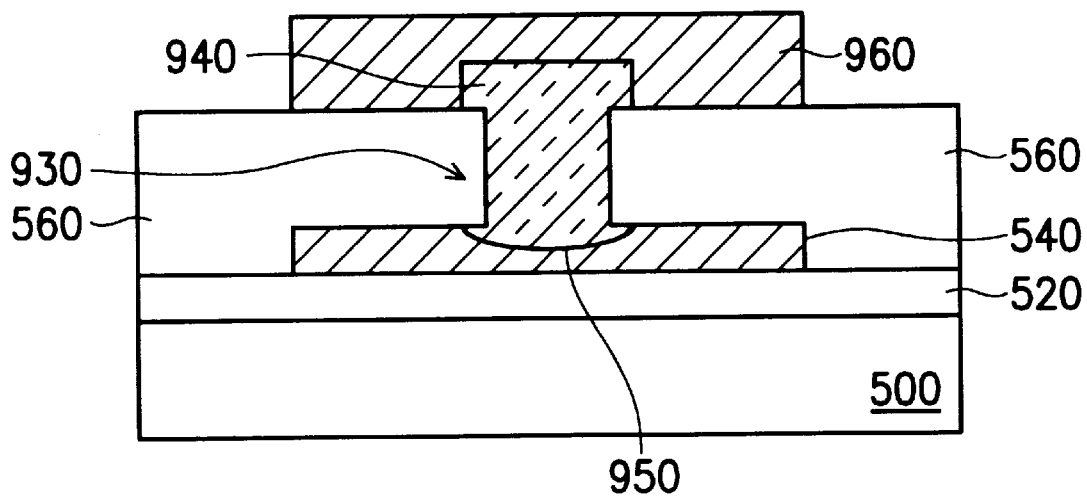

Referring to FIG. 13, a conducting layer made of metal materials is formed over the substrate 500 by sputtering, such as magnetron DC sputtering. Then the metal layer is selectively etched in accordance with a desired pattern to form an upper metal wiring 960 as an upper interconnection line.

The upper metal wiring 960 can be composed of a single aluminum (Al) or aluminum alloy such as AlSiCu or AlCu. Electrical connections are made between the upper metal wiring 940 and the lower metal wiring 540 through the use of via plug 930.

Accordingly, the multilevel interconnect structure includes a lower metal wiring 540, an IMD layer 560 formed on the lower metal wiring 540, an upper metal wiring 960 formed partly on IMD layer 560, and an I-shaped via plug 930 for electrically connecting the lower metal wiring 540 and the upper metal wiring 960. The I-shaped via plug 930 has an upper portion 940 which laterally extends into the upper metal wiring 960, and a lower portion 950 which undercuts the lower metal wiring 540.

The multilevel interconnect structure fabricated by the method of the invention therefore provides the advantages of: (1) increasing the metal wiring/via plug contact area without increase the via hole size; (2) hooking the via plug into metal wiring by using the upper portion which laterally extends into the upper metal wiring, and a lower portion which undercuts the lower metal wiring. Therefore, the multilevel interconnect structure of the invention can be applied in integrated devices to reduce electromigration.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention and to practice various other embodiments and make various modifications suited to the particular use contemplated. It is intended that the scope of the invention be defined by the following claims or their equivalents.

What is claimed is:

1. A multilevel interconnect structure for an integrated circuit comprising:

a first conducting layer;

a dielectric layer formed on said first conducting layer;

a second conducting layer formed partly on said dielectric layer; and an I-shaped via plug for electrically connecting said first conducting layer and said second conducting layer, wherein said I-shaped via plug has an upper portion laterally extending into said second conducting layer and a lower portion undercutting said first conducting layer of said multilevel interconnect structure.

2. The multilevel interconnect structure of claim 1, wherein said first conducting layer is made of metal.

3. The multilevel interconnect structure of claim 2, wherein said metal is selected from the group of aluminum (Al) and aluminum alloy.

4. The multilevel interconnect structure of claim 2, wherein said aluminum alloy is selected from the group of AlSiCu and AlCu.

5. The multilevel interconnect structure of claim 1, wherein said dielectric layer is made of silicon dioxide.

6. The multilevel interconnect structure of claim 1, wherein said second conducting layer is made of metal.

7. The multilevel interconnect structure of claim 6, wherein said metal is selected from the group of aluminum (Al) and aluminum alloy.

8. The multilevel interconnect structure of claim 7, wherein said aluminum alloy is selected from the group of AlSiCu and AlCu.

9. The multilevel interconnect structure of claim 1, wherein said via plug is made of tungsten (W).

* * * * *